United States Patent [19]

Linn et al.

[11] 3,986,016

[45] Oct. 12, 1976

[54] SINGLE CHIP MAGNETIC BUBBLE PROCESSOR

[75] Inventors: John Charles Linn; Rex Alan Naden, both of Richardson, Tex.

[73] Assignee: Texas Instruments Incorporated, Dallas, Tex.

[22] Filed: Feb. 10, 1975

[21] Appl. No.: 548,652

[52] U.S. Cl. .............................. 235/156; 307/88 LC; 340/172.5
[51] Int. Cl.² ....................... G06F 1/00; G06F 7/38
[58] Field of Search .................. 235/156; 340/172.5, 340/174 TF; 307/88 LC

[56] References Cited
UNITED STATES PATENTS

| | | |
|---|---|---|
| 3,689,751 | 9/1972 | Woo Foung Chow .... 340/174 TF X |
| 3,750,106 | 7/1973 | Caron .............................. 340/172.5 |
| 3,753,253 | 8/1973 | Smith ............................ 340/174 TF |
| 3,774,153 | 11/1973 | Ahamed .................... 340/146.1 AL |
| 3,894,223 | 7/1975 | Majima et al. .................. 235/156 X |

*Primary Examiner*—David H. Malzahn
*Attorney, Agent, or Firm*—Harold Levine; James T. Comfort; William E. Hiller

[57] ABSTRACT

A magnetic bubble processor comprising components for causing the movement of magnetic bubbles and a single chip having a layer of magnetic material in which magnetic bubbles can be moved. The chip comprises an input circuit for conveying electrical data and instructions into the processor and a generator responsive to the input data and instructions for producing magnetic bubbles representing bits of information. Paths are provided on the chip for routing magnetic bubbles within the processor as well as a memory organization accessible for the storage and retrieval of magnetic bubble information. The chip also includes magnetic bubble logic for performing mathematical operations and for providing magnetic bubble output information representing the results thereof. Further, the chip includes a magnetic bubble decoder for deciphering information and providing magnetic bubble output signals determinative of operations the processor is to perform and a magnetic bubble circuit responsive to the decoder output signals for controlling the routing of magnetic bubble information along predetermined paths within the processor, the storage and retrieval of information in the memory, and for instructing the logic as to which mathematical or logical operations are to be performed. A magnetic bubble detector on the chip converts the output of the logic from magnetic bubble information into discrete processor electrical output signals. The converted information is conveyed out of the processor by an output circuit on the chip. Thus, complex programs involving mathematical and logical operations using magnetic bubble data and instructions may be performed on one chip with a minimum of external circuitry and control required.

9 Claims, 1 Drawing Figure

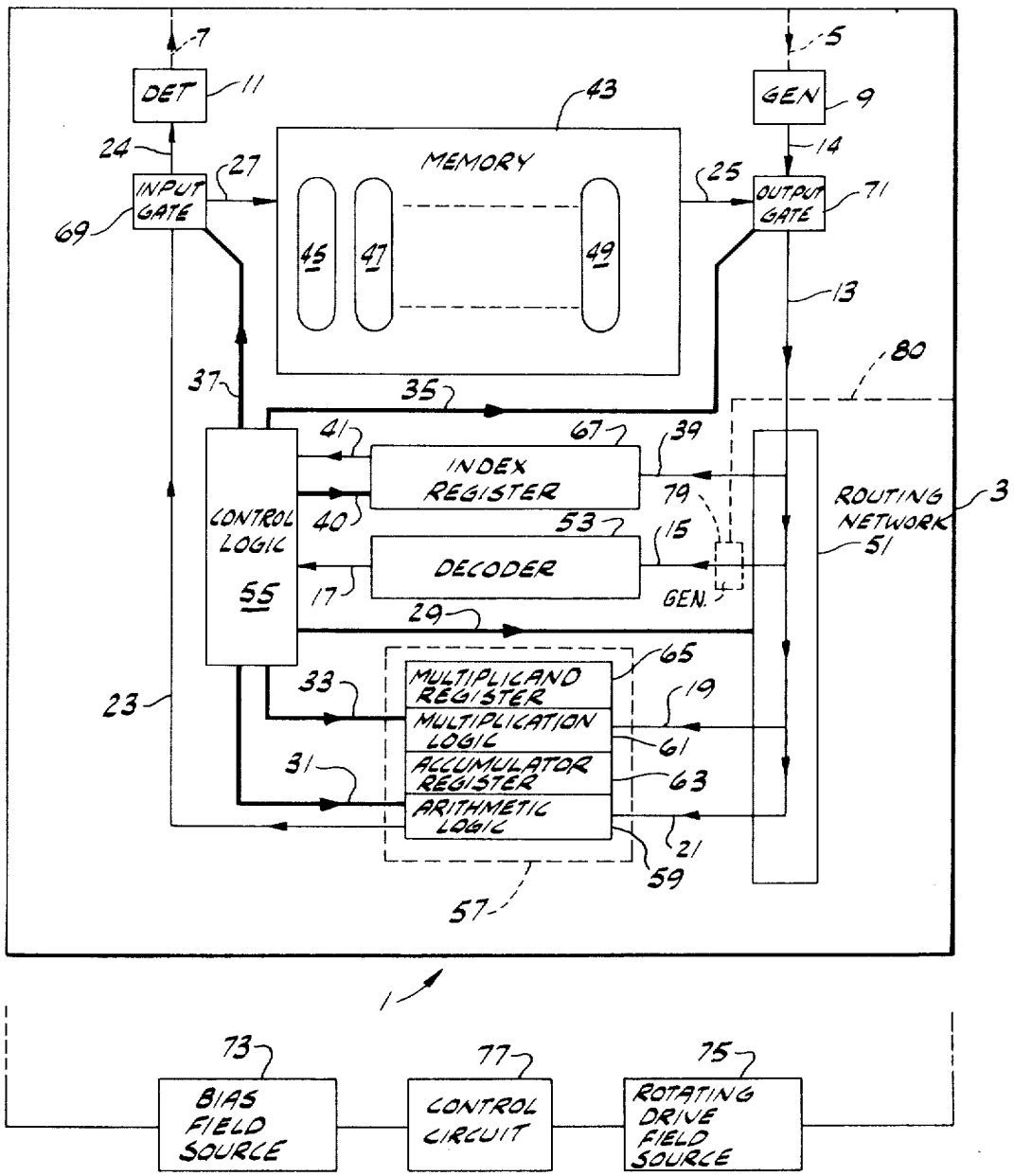

SINGLE CHIP MAGNETIC BUBBLE PROCESSOR

BACKGROUND OF THE INVENTION

This invention relates to data processors and more particularly to single chip magnetic bubble processors.

A processor is a device for taking input data and using it in a fixed routine of mathematical and logical operations to obtain an output. Processors are useful in so-called "dedicated" applications in which a fixed routine is used for developing information from one source to provide control outputs or reduced data to that source. Conventional processors are composed of memories, input and output circuits, registers, logic, control, and timing circuits. Processor usage is primarily restricted by its memory capacity, although factors such as power requirements, component reliability, and interfacing with other systems are also design restrictions.

Magnetic bubble devices, implemented on magnetic bubble chips, have been developed which perform memory storage functions as well as duplicate the operation of many conventional electronic circuits. A principal benefit of using chips is their ability to store many more bits of information in a much smaller space than is presently possible using such memory elements as ferrite cores, and to perform similar logic and mathematical operations as performed by conventional circuits. Computers have been designed employing magnetic bubble technology, one such design being disclosed in U.S. Pat. No. 3,798,607 Minnick et al, issued Mar. 19, 1974. This design has a memory of over four thousand 16-bit words and can be implemented using six or more magnetic bubble chips. However, even this computer design still requires numerous interfaces of magnetic bubble chips with conventional electronic circuits in order to access the memory, control the flow of data and perform some of the required mathematic and logic program operations and as such has weight, volume, power needs, program size and, for potential military applications, radiation hardness disadvantages.

SUMMARY OF THE INVENTION

Among the several objects of this invention may be noted the provision of a magnetic bubble processor constructed on a single chip; the provision of such a processor using only magnetic bubble devices and circuits; the provision of such a processor having only a single input and output; the provision of such a processor which performs operations in a serial manner, and the provision of such a processor which is compact in size, light in weight, low in power requirements, high in reliability, and able to withstand radiation environments without performance deterioration.

Briefly, a magnetic bubble processor of the present invention comprises means for causing the movement of magnetic bubbles and a single chip having a layer of magnetic material in which magnetic bubbles can be moved. The chip comprises an input circuit for conveying electrical data and instructions into the processor and means for generating magnetic bubbles representing bits of information in response to the input data and instructions. The chip has paths for routing magnetic bubbles within the processor and a memory organization accessible for the storage and retrieval of magnetic bubble information. Magnetic bubble logic means are provided on the chip for performing mathematical operations and for providing magnetic bubble output information representing the results thereof. Further, the chip includes magnetic bubble means for decoding information and providing magnetic bubble output signals for determining the operations the processor is to perform and magnetic bubble means responsive to the decoding means output signals for controlling the routing of magnetic bubble information along predetermined paths within the processor, the storage and retrieval of information in the memory, and for instructing the logic means as to which mathematical or logical operations are to be performed. A magnetic bubble detection means on the chip converts the output of the logic means from magnetic bubble information into discrete processor electrical output signals. The converted information is conveyed out of the processor by an output circuit. Thus, complex programs involving mathematical and logical operations using magnetic bubble data and instructions may be performed on one chip with a minimum of external circuitry and control required. Also outputs from the bubble detection means are used to synchronize data read in through the input means.

Other objects and features will be in part apparent and in part pointed out hereinafter.

BRIEF DESCRIPTION OF THE DRAWING

The single FIGURE is a plan view diagrammatically illustrating a single chip processor of the present invention.

DESCRIPTION OF A PREFERRED EMBODIMENT

Referring now to the drawing, a single chip magnetic bubble processor of the present invention is indicated generally at 1. Chip 1 comprises a suitable magnetic layer 3, such as epitaxial magnetic garnet film on a nonmagnetic garnet substrate, and has electrical input and output circuits 5 and 7 for routing data to and from the chip, a generator 9 for converting electrical data inputs into magnetic bubbles, and a detector 11 for sensing magnetic bubbles and providing a discrete electrical output in response thereto. Magnetic bubble data routing paths 13, 14, 15, 17, 19, 21, 23, 24, 25, 27, 39, and 41 are provided on the chip, being shown as thin solid line paths in the drawing. Control bubble routing paths 29, 31, 33, 35, 37, and 40 are also provided, being shown as the thicker solid line paths in the drawing. Also shown in the drawing is a magnetic bubble memory organization 43 which includes a plurality of storage loops of which three 45, 47, and 49, are shown. Access to and from memory 43 is by gates 69 and 71 respectively. A routing network 51 is used to maneuver magnetic bubbles from bubble generator 9 or memory 43 to a decoder logic 53 where program instructions are decoded and output signals are provided to a control logic 55 which commands the processor operations. Routing network 51 also supplies magnetic bubble data to an arithmetic logic section 59 or multiplication logic section 61 of a mathematical logic unit 57 which further includes an accumulator register 63 for holding the results of mathematical operations and a multiplicand register 65 in which bubbles representing the multiplicand are placed prior to performing a multiplication. An index register 67 is used for performing repetitive program operations as will be discussed. A bias field source 73 maintains all the magnetic bubbles in the chip 1 at a desired size, while a rotating field drive source 75 under the control of a circuit 77 generates an in-plane magnetic field parallel to the surface of chip 1 for moving all the bubbles on the chip simultaneously. The bubble routing paths 13 through 41, and the loops 45, 47 and 49 of memory 43 are defined by any of the conventional means, such as patterns of circuit elements of magnetically soft overlay material, e.g., alternating bar and T-shaped segments, etc., all as are well-known in the art.

The memory 43 is an all-bubble memory and may be constituted in one of a number of well-known ways, one of which is disclosed in copending application, Ser. No. 469,493, filed May 13, 1974. All the other control and operational circuits used in the processor are implemented using magnetic bubble devices such as switches and logic gates operating on the principle of bubble-bubble repulsion, many of which are disclosed in copending application, Ser. No. 468,963, filed May 10, 1974. Further, the multiplication section 61 of the mathematical operations logic 57 is a fast-serial multiplier whose design and operation are disclosed in copending application, Ser. No. 529,768, filed Dec. 5, 1974. It is to be noted that all the logic and mathematical elements utilized within the processor perform serial operations in carrying out their respective functions. Further, magnetic bubbles representing data and instructions are serially multiplexed as they are routed within the processor to keep the number and length of control and data paths to a minimum and to maintain processor speed of operation. Series multiplexing of bubbles is inherent in the memory 43 design and operation. Bubbles stored in loops 45, 47, and 49 of memory 43 circulate therearound in parallel. However, when a group of bubbles comprising a "word" of information is required from the memory, it is transferred from the loops 45, 47 and 49 one bit at a time onto routing path 25 and proceeds in a serial manner thereon. When a bubble word is returned to memory 43 on path 27, it is transferred one bit at a time from input path 27 into the memory loops 45, 47, and 49.

Since a processor 1 of the present invention may be used in a dedicated control application, a preset program of instructions and data, usually constants, may be initially loaded into memory 43 either using a set of specially encoded commands or an optional separate generator 79 and electrical input circuit 80. Using this arrangement, electrical inputs on circuit 80 cause bubble generator 79 to produce a series of magnetic bubbles on path 15 to decoder 53. Decoder 53 provides output signals to control logic 55 by which logic 55 will supply appropriate outputs on control bubble paths 35, 29, 31, and 37 to have bubbles created by generator 9 formed into the set of instructions necessary to make up the desired program. In use, at the start of a program, operational data will be read into the processor from external sources, stored in the memory 43 until required for use in a particular logic or mathematical operation, and then the results of the operation are either restored in the memory or converted into an appropriate discrete processor output signal and supplied to external circuits for their use on output circuit 7. The stored program can be performed at a rate of approximately one thousand instructions per second using a 1 MHz bubble propagation rate.

Information is stored in memory 43 in the form of words, each word comprising a predetermined number of binary bits, the bit values being represented by the presence or absence of a magnetic bubble in the respective bit location. Memory 43 may have, for example, a capacity of 128,000 bits or four thousand 32 bit words. The format for each instruction word is to have a first bit representing an index bit whose function will be described, a first set of bits whose value indicates a particular address or location in memory 43 and a second set of bits whose value equates to a particular program instruction. The memory address tells the processor where in memory 43 to go to either store magnetic bubbles or where to go to retrieve magnetic bubbles. The instruction bits indicate what is to be done with the magnetic bubbles in or assigned to a particular memory location.

At the start of a program in processor 1 control logic 55 supplies a control bubble on path 35 to gate 71 to actuate gate 71 to permit magnetic bubbles routed out of memory 43 on path 25 to be transferred to path 13. A second control bubble from control logic 55 on path 29 to routing network 51 actuates a gate in routing network 51 to transfer bubbles from path 13 to path 15 where they become inputs to decoder 53. Decoder 53, in effect, deciphers the encoded information word whose make-up has been previously discussed, and provides output signals on path 17 to control logic 55 indicating to logic 55 what functions the processor is next to perform and where the data required for that operation can be found or is to be stored. In response to these signals, logic 55 supplies control bubbles on the appropriate paths.

Since, at the start of the program operational data is required, electrical inputs on circuit 5 from external sources are applied to bubble generator 9 which responds by generating magnetic bubbles on path 14 which are routed along paths 13 and 21 to the mathematic logic 57 and are placed in accumulator register 63. When an appropriate store command is decoded by logic 53, the bubbles in accumulator register 63 are routed on path 23 to gate 69, which is actuated by a control bubble on path 37 from control logic 55, to transfer the bubbles representing data from path 23 to path 27 so that the bubbles may be stored in loops 45, 47 or 49 of memory 43 in the memory location specified in the decoded word of information.

After all the necessary data has been stored in memory 43, logical and mathematical instructions will be interpreted by decoder 53, which will provide appropriate output signals to control logic 55, in response to which the necessary data will be retrieved from loops 45, 47 and 49 of memory 43 and routed on path 25 through gate 71 to path 13 and thence to routing network 51. If an arithmetic operation is to be performed, control bubbles will be supplied on path 29 to network 51 so that the data bubbles will be transferred from path 13 to path 21 and become inputs to the arithmetic logic 59 of mathematic logic 57. Control bubbles on path 31 to arithmetic logic 59 will command the operations in logic 59 so that the appropriate addition, subtraction, etc., operations are performed. If a multiplication is to be performed, then the control bubbles on path 29 to routing network 51 actuate the appropriate gates to transfer the data bubbles from path 13 to path 19 where they become inputs to the multiplication logic portion 61 of mathematic logic 57. If the bubbles represent the multiplicand of two numbers to be multiplied, then the bubbles are entered into the multiplicand register 65. Control bubbles on path 33 from logic 55 oversee the multiplication operation. The results of operations performed by either arithmetic logic 59 or multiplication logic 61 are stored in accumulator register 63. At the end of a set of operations, the resultant contents of register 63 are routed on path 23 to gate 69. If the results are to be stored in memory 43, gate 69 is actuated as before. Otherwise the bubbles continue on path 24 to detector 11 which is typically a magnetoresistive device sensitive to the presence of magnetic bubbles to provide a discrete electrical output on circuit 7 in response thereto.

If iterative operations are to be performed, for example, the addition of a series of numbers, the index register 67 is used. An index bit, as noted, is part of the instruction format of each word processed by the decoding logic 53. When a series of similar operations are to be performed, a predetermined number is loaded into the index register 67 pursuant to a coded instruction. As later instructions containing an appropriate index bit are processed by decoder 53, the bits in the instruction containing the address in memory 43 are added to the contents of index register 67 and the result is provided to the control logic 55 as the actual memory location where the data to be used in the operation can be found. A subsequent instruction has control logic 55 increment or decrement index register 67 by supplying control bubbles on path 40, and determine the new contents of the register. As long as the contents of index register 67 do not reach a predetermined value the same steps in the processor program will be repeated. However, when the contents of index register 67 do reach the predetermined value, the processor program will branch out of its iterative portion and proceed to a new instruction. This feature thus permits the reduction in the number of instructions required to perform a program involving repetitive operations.

As can be seen from FIG. 1, only two electrical circuits 5 and 7 interface the processor chip 1 with other circuits. Thus, the necessary electronic circuitry required to normally support a processor is effectively reduced while a highly reliable system for control or similar purposes is maintained. Further, all the functional elements used in the processor can be constituted by using bubble-bubble interaction logic.

In view of the above, it will be seen that the several objects of the invention are achieved and other advantageous results attained.

As various changes could be made in the above constructions without departing from the scope of the invention, it is intended that all matter contained in the above description or shown in the accompanying drawing shall be interpreted as illustrative and not in a limiting sense.

What is claimed is:

1. A single chip magnetic bubble processor comprising:
    a single chip having a layer of magnetic material capable of supporting the controlled movement of magnetic bubbles therein in response to the reorientation of an in-plane rotary magnetic field, said chip including thereon:
    an electrical input circuit for receiving external electrical data and instructions to be entered into the processor;
    magnetic bubble generator means operably connected to said electrical input circuit for generating magnetic bubbles in said layer of magnetic material representing bits of information in response to the electrical data and instructions from said electrical input circuit;
    bubble propagation paths for routing magnetic bubbles within the processor and including a path operably associated with said magnetic bubble generator means for receiving magnetic bubbles generated thereby;
    a magnetic bubble memory organization interconnected within said bubble propagation paths so as to be accessible for the storage and retrieval of magnetic bubble information via said bubble propagation paths;
    magnetic bubble logic means interconnected within said bubble propagation paths for performing mathematical operations and for providing magnetic bubble output information representing the results thereof;
    magnetic bubble decoder means operably connected to said magnetic bubble generator means via said bubble propagation paths for decoding magnetic bubble information and providing magnetic bubble output signals for determining the operations to be performed by the processor;
    magnetic bubble control logic means operably connected to said magnetic bubble memory organization, said magnetic bubble logic means and said magnetic bubble decoder means via said bubble propagation paths and responsive to the magnetic bubble output signals from said magnetic bubble decoder means for controlling the routing of magnetic bubble information along said bubble propagation paths, the storage of magnetic bubble information in said magnetic bubble memory organization and retrieval therefrom, and for instructing said magnetic bubble logic means as to which mathematical operations are to be performed thereby;
    magnetic bubble detection means operably connected to said magnetic bubble logic means via said bubble propagation paths for receiving the magnetic bubble output information therefrom and converting said magnetic bubble output information into discrete processor electrical output signals; and
    an electrical output circuit operably connected to said magnetic bubble detection means for transmission of the discrete processor electrical output signals from the processor, whereby complex programs involving mathematical and logical operations using magnetic bubble data and instructions may be performed on said single chip.

2. A processor as set forth in claim 1 wherein said magnetic bubble logic means includes a first means for performing arithmetic operations and a second means for performing multiplication operations connected to said magnetic bubble control logic means via respective bubble propagation paths.

3. A processor as set forth in claim 2 wherein said magnetic bubble logic means further includes an accumulator register for containing the results of the operations performed by the arithmetic operation means and the multiplication operation means.

4. A processor as set forth in claim 2 wherein the multiplication operation means further includes a register for containing bits of magnetic bubble information representing the multiplicand used in performing multiplication operations.

5. A processor as set forth in claim 1 further including an index register operably connected to said magnetic bubble memory organization and to said magnetic bubble control logic means via said bubble propagation paths for use in performing iterative program operations.

6. A processor as set forth in claim 1 further including a first gate means interconnected within said bubble propagation paths to said magnetic bubble memory organization and responsive to said magnetic bubble control logic means for moving magnetic bubble information out of said magnetic bubble memory organization via one of said bubble propagation paths for retrieval thereof and a second gate means interconnected within said bubble propagation paths to said magnetic bubble memory organization and responsive to said magnetic bubble control logic means for moving magnetic bubble information into the magnetic bubble memory organization via one of said bubble propagation paths for storage therein.

7. A processor as set forth in claim 1 wherein said magnetic bubble control logic means further includes means for serially multiplexing magnetic bubble information being routed within the processor.

8. A processor as set forth in claim 1 wherein said magnetic bubble decoder means and said magnetic bubble control logic means are serially interconnected via bubble propagation paths, and said magnetic bubble control logic means is serially connected to said magnetic bubble logic means.

9. A processor as set forth in claim 1 further including a second electrical input circuit for receiving external preset electrical data programs and instructions and a second magnetic bubble generator means operably connected to said second electrical input circuit and to said magnetic bubble decoder means for generating magnetic bubbles in said layer of magnetic material representing the preset electrical data programs and instructions for loading said magnetic bubble information representative of said preset electrical data programs and instructions into said magnetic bubble memory organization via said magnetic bubble decoder means and said magnetic bubble control logic means along said bubble propagation paths.

* * * * *